(12) United States Patent
Kim et al.

(10) Patent No.: US 9,466,774 B2
(45) Date of Patent: Oct. 11, 2016

(54) LIGHT SOURCE AND DISPLAY DEVICE INCLUDING THE SAME

(71) Applicant: Samsung Display Co., Ltd., Yongin, Gyeonggi-Do (KR)

(72) Inventors: Seung-Wan Kim, Asan-si (KR); Jaekyu Park, Cheonan-si (KR); Youngsup Kwon, Gwangmyeong-si (KR); Jin-Won Jang, Asan-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/688,525

(22) Filed: Apr. 16, 2015

(65) Prior Publication Data

US 2016/0099394 A1    Apr. 7, 2016

(30) Foreign Application Priority Data

Oct. 2, 2014 (KR) .................. 10-2014-0133352

(51) Int. Cl.
| H01L 27/00 | (2006.01) |
| H01L 33/00 | (2010.01) |
| H01L 33/62 | (2010.01) |
| H01L 27/15 | (2006.01) |

(52) U.S. Cl.
CPC ............ *H01L 33/62* (2013.01); *H01L 27/156* (2013.01)

(58) Field of Classification Search
CPC ........... H01L 27/0248; H01L 27/0256; H01L 27/156; H01L 33/483; H01L 33/505; H01L 33/62; H01L 27/251
See application file for complete search history.

(56) References Cited

U.S. PATENT DOCUMENTS

| 8,184,105 | B2 * | 5/2012 | Lin | G06F 3/044 178/18.01 |
| 8,319,429 | B2 * | 11/2012 | Wu | H01L 25/167 257/99 |
| 8,882,296 | B2 * | 11/2014 | Chen | H01R 13/6485 362/249.02 |
| 2007/0085112 | A1 | 4/2007 | Yamazaki et al. | |
| 2011/0097834 | A1 | 4/2011 | Yamazaki et al. | |
| 2011/0284903 | A1 | 11/2011 | Loh et al. | |
| 2012/0050632 | A1 * | 3/2012 | Shih | B82Y 20/00 349/42 |
| 2012/0282717 | A1 | 11/2012 | Yamazaki et al. | |
| 2014/0111894 | A1 * | 4/2014 | Schug | H01L 27/0248 361/56 |
| 2015/0083568 | A1 * | 3/2015 | Park | G06F 3/0202 200/600 |

FOREIGN PATENT DOCUMENTS

| JP | 4861366 B2 | 11/2011 |
| JP | 2012-221900 A | 11/2012 |
| KR | 10-2005-0059689 A | 6/2005 |
| KR | 10-2006-0130423 A | 12/2006 |
| KR | 10-2013-0055203 A | 5/2013 |
| KR | 10-2013-0070273 A | 6/2013 |

* cited by examiner

*Primary Examiner* — Nikolay Yushin
(74) *Attorney, Agent, or Firm* — Robert E. Bushnell, Esq.

(57) ABSTRACT

A display device includes a light source which comprises a first line receiving power, a second line connected to a ground terminal, a plurality of light source units generating light, first to k-th conductive patterns connecting the light source units to the first and second lines in series, where k is a natural number greater than 1, and a discharge pattern disposed adjacent to the conductive patterns and the second line, and leading static electricity flowing into the conductive patterns to the second line.

19 Claims, 6 Drawing Sheets

LIGHT SOURCE AND DISPLAY DEVICE INCLUDING THE SAME

CLAIM OF PRIORITY

This U.S. non-provisional patent application claims priority under 35 U.S.C. §119 of Korean Patent Application No. 10-2014-0133352, filed on Oct. 2, 2014, the entire contents of which are hereby incorporated by reference.

BACKGROUND OF THE INVENTION

The present invention relates to a light source and a display device including the same, and more particularly, to a light source capable of preventing a device from being damaged by static electricity, and a display device including the same.

Typically, a display device includes a display panel displaying an image using light and a light source providing the light to the display panel. The light source includes a plurality of light source units and a light source substrate on which the plurality of light source units are mounted. The plurality of light source units are connected in series by a conductive pattern.

The plurality of light source units receive a driving voltage to generate light and provide the generated light to the display panel. The display panel includes a plurality of pixels. The plurality of pixels may display an image using the light received from the light source units.

The light source units (e.g., light emitting diodes (LEDs)) are vulnerable to static electricity. When external static electricity is applied to the light units, the light units may be damaged. Accordingly, technology is required to protect the light source units from the external static electricity.

SUMMARY OF THE INVENTION

The present invention provides a light source and a display device including the same capable of preventing a device from being damaged by static electricity.

Embodiments of the invention provide light sources including: a first line receiving power; a second line connected to a ground terminal; a plurality of light source units generating light; first to k-th conductive patterns connecting the light source units in series to the first and second lines in series, where k is a natural number greater than 1; and a discharge pattern disposed adjacent to the conductive patterns and the second line, and directing static electricity flowing into the conductive patterns to the second line.

In some embodiments, the first to k-th conductive patterns and the light source units may be arranged in a first direction with a uniform interval and connected, and the first line may be connected to the first conductive pattern among the first to k-th conductive patterns and the second line is connected to the k-th conductive pattern among the first to k-th conductive patterns.

In other embodiments, the second line may include: a first extension unit extending along a second direction intersecting the first direction, and connected to the k-th conductive pattern; and a second extension unit extending from the first extension unit along the first direction and disposed so as to face the first to k-th conductive patterns in a second direction.

In still other embodiments, the discharge pattern may be disposed between the second to k-th conductive patterns (among the first to k-th conductive pattern) and the second extension unit, and may extend in the first direction.

In even other embodiments, the light source may further include a discharge device connected to the first conduction pattern (among the first to k-th conduction patterns) and the second line.

In yet other embodiments, the discharge device may include a Zener diode, and an anode electrode of the Zener diode may be connected to the second line, and a cathode electrode of the Zener diode may be connected to the first conductive pattern.

In further embodiments, the light source units respectively may include light emitting diodes and be serially connected in a forward direction through the first to k-th conductive patterns.

In still further embodiments, the light source may further include a substrate on which the first line, the second line, the light source units, the conduction patterns and the discharge pattern are disposed.

In even further embodiments, the discharge pattern may include a plurality of sub-discharge patterns extending in the first direction and arrayed in the first direction, wherein the sub-discharge patterns may be disposed between the second to k-th conductive patterns and the second extension unit so as to respectively face the corresponding second to k-th conductive patterns.

In yet further embodiments, the second to k-th conductive patterns may include a plurality of first protruding parts protruding toward the sub-discharge patterns from surfaces of the second to k-th conductive patterns facing the sub-discharge patterns, and the second extension unit may include a plurality of second protruding parts protruding toward the sub-discharge patterns from a surface of the second extension unit facing the sub-discharge patterns.

In much further embodiments, the sub-discharge patterns may include, third protruding parts protruding toward the second to k-th conductive patterns from surfaces of the sub-discharge patterns facing the second to k-th conductive patterns; and fourth protruding parts protruding toward the second extension unit from the surfaces of the sub-discharge patterns facing the second extension unit, wherein the third protruding parts are disposed so as to respectively face the corresponding first protruding parts, and the fourth protruding parts are disposed so as to respectively face the corresponding second protruding parts. The first to fourth protruding parts may have a mountain shape.

In still further embodiments, the discharge pattern may include a plurality of sub-discharge patterns disposed between the second to k-th conductive patterns and the second extension unit, and having a diamond shape.

In even further embodiments, each of the second to k-th conductive patterns may include a plurality of first protruding parts protruding toward the sub-discharge patterns from the surfaces of the second to k-th conductive patterns facing the sub-discharge patterns, and the second extension unit may include a plurality of second protruding units protruding toward the sub-discharge patterns from a surface of the second extension unit facing the sub-discharge patterns, wherein the sub-discharge patterns are disposed between the first and second protruding parts facing each other.

In yet further embodiments, the discharge pattern may include a plurality of sub-discharge patterns disposed between adjacent conductive patterns among the second to k-th conductive patterns and extending in the second direction.

In still further embodiments, the conductive patterns may include a plurality of protruding parts protruding toward the sub-discharge patterns from right surfaces of the conductive patterns in the first direction, and the second extension unit comprises a plurality of second protruding parts extending toward the sub-discharge patterns from a surface of the second extension unit facing the sub-discharge patterns in the second direction.

In yet further embodiments, the sub-discharge patterns may include: a plurality of third protruding parts protruding so as to respectively face the corresponding first protruding parts; and fourth protruding parts protruding so as to face the second protruding parts in the second direction; wherein the fourth protruding parts protrude from ends of the sub-discharge patterns extending in the second direction, and the third protruding parts are disposed so as to respectively face the corresponding first protruding parts and the fourth protruding parts are disposed so as to respectively face the corresponding second protruding parts.

In further embodiments, the light source may further include at least one connection terminal disposed on the discharge pattern, wherein the connection terminal comprises a conductive material and penetrates the discharge pattern so as to be connected to the ground terminal.

In further embodiments, the second to k-th conductive patterns may include a plurality of first protruding parts protruding toward the discharge pattern from surfaces of the second to k-th conductive patterns facing the discharge pattern, and the discharge pattern may include a plurality of third protruding parts protruding toward the second to k-th conductive patterns from a surface of the discharge pattern facing the second to k-th conductive patterns, wherein the first protruding parts may be disposed so as to respectively face the corresponding third protruding parts.

In other embodiments of the invention, a display device includes: a light source emitting a light; and a display panel receiving the light so as to display an image. The light source comprises: a first line receiving power; a second line connected to a ground terminal; a plurality of light source units generating light; a plurality of conductive patterns connecting the light source units in series to the first and second lines; and a discharge pattern disposed adjacent to the conductive patterns and the second line so as to direct static electricity flowing into the conductive patterns to the second line.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION OF THE INVENTION

Figure 1:
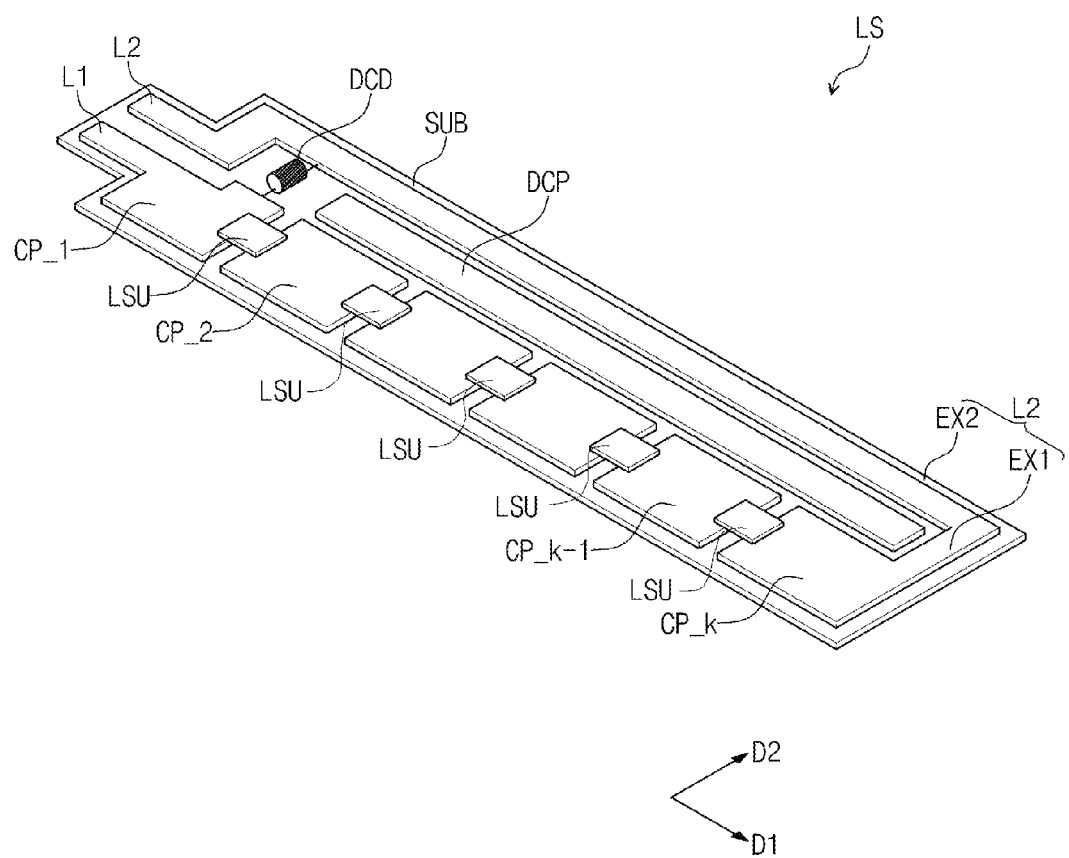
FIG. 1 is a perspective view of a light source according to an embodiment of the invention.

Advantages and features of the present invention, and methods for achieving the same, will be clear with reference to exemplary embodiments described later in detail together with the accompanying drawings. However, the present invention is not limited to the following exemplary embodiments, but may be realized in various forms. In other words, the present exemplary embodiments are provided to completely disclose the present invention and enable a person having an ordinary skill in the art to understand the scope of the invention. The present invention should be defined by the scope of the accompanying claims. Throughout this specification, like numerals refer to like elements.

When an element or a layer is referred to as being "on" another element or layer, it can be directly on the other element or layer, or intervening layers or elements may also be present. In contrast, when an element or layer is referred to as being "directly on" another element or layer, there are no intervening elements or layers present. The term "and/or" includes any and all combinations of one or more of the associated listed items.

Spatially relative terms, such as "above," "upper," "beneath," "below," "lower," and the like, may be used herein for ease of description to describe one element or feature's relationship to another (other) element(s) or feature (s) as illustrated in the figures. It will be understood that the spatially relative terms are intended to encompass different orientations of the device in use or operation in addition to the orientation depicted in the figures. Throughout this specification, like numerals refer to like elements.

Also, although terms like "a first" and "a second" are used to describe various members, components and/or sections in various embodiments of the present invention, the members, components and/or sections are not limited to these terms. These terms are used only to differentiate one member, component or section from another one. Therefore, a first member, a first component, or a first section referred to below can be referred to as a second member, a second component, or a second section within the technical spirit of the present invention.

Exemplary embodiments are described herein with reference to cross-sectional views and/or plan views that are schematic illustrations of exemplary embodiments. As such, variations from the shapes of the illustrations as a result, for example, of manufacturing techniques and/or tolerances are to be expected. Thus, exemplary embodiments should not be construed as limited to the particular shapes of regions illustrated herein but may be construed to include deviations in shapes that result, for example, from manufacturing. Thus, the regions illustrated in the figures are schematic in nature and their shapes may be intended to illustrate the actual shape of a region of a device and are not intended to limit the scope of exemplary embodiments.

Hereinafter, exemplary embodiments of the present invention will be described in detail in conjunction with the accompanying drawings.

FIG. 1 is a perspective view of a light source according to an embodiment of the present invention.

Referring to FIG. 1, a light source LS includes a substrate SUB, a plurality of light source units LSUs, a first line L1, a second line L2, a discharge device DCD, a plurality of conductive patterns CP_1 to CP_k, where k is a natural number greater than 1, and a discharge pattern DCP.

The substrate SUB is extended in a first direction D1. In detail, the substrate SUB has a long side extending in the first direction D1 and a short side extending in a second direction intersecting the first direction D1.

The light source units LSUs, the first line L1, the second line L2, the discharge device DCD, the conduction patterns CP_1 to CP_k, and the discharge pattern DCP are disposed on the substrate SUB. The first line L1, the second line L2, and the conductive patterns CP_1 to CP_k include conductive materials. Hereinafter, the conductive patterns CP_1 to CP_k are referred to as first to k-th conductive patterns along the disposed sequence extending in the first direction D1.

The first line L1 may be connected to a power supply terminal (not shown) and receive power. The second line L2 may be connected to a ground terminal (not shown). The light source units LSUs may be serially connected to the first and second lines L1 and L2, respectively, through the first to k-th conductive patterns CP_1 to CP_k, respectively. The first to k-th conductive patterns CP_1 to CP-k are disposed so as to face the second line L2.

In detail, the first to k-th conductive patterns CP_1 to CP_k and the light source units LSUs may be arrayed in the first direction D1 with a uniform interval. The light source units LSUs may be connected in series through the first to k-th conductive patterns CP_1 to CP_k.

For example, each of the light source units LSUs may be electrically connected to the conductive patterns CP_1 to CP_k adjacent to each other with the light source unit LSU therebetween in the first direction D1. In other words, the light source units LSUs adjacent to each other may be electrically connected to each other through the conductive patterns CP_1 to CP_k disposed between the light source units LSUs.

Each of the light source units LSUs may include a light emitting diode. Anode and cathode electrodes of the light source units LSUs adjacent to each other are electrically connected through the conductive patterns CP_1 to CP_k disposed between the light source units LSUs adjacent to each other.

An anode electrode of the light source unit LSU disposed leftmost in the first direction D1 is connected to the first line L1 through the first conductive pattern CP_1 among the first to k-th conductive patterns CP_1 to CP_k. A cathode electrode of the light source unit LSU disposed rightmost in the first direction D1 is connected to the second line L2 through the k-th conductive pattern CP_k among the first to k-th conductive patterns CP_1 to CP_k. Accordingly, the light source units LSUs are serially connected in the forward direction.

The first line L1 is disposed on one side of the substrate SUB in the first direction D1 and is connected to the first conductive pattern CP_1. The second line L2 includes a first extension unit EX1 and a second extension unit EX2. The first extension unit EX1 of the second line L2 is disposed on another side of the substrate SUB in the first direction D1 and is connected to the k-th conductive pattern CP_k. The second extension EX2 of the second line L2 is disposed on one side of the substrate SUB in the second direction D2 and extends from the first extension unit EX1 in the first direction D1. The second extension unit EX2 may be disposed so as to face the conductive patterns CP_1 to CP_k in the second direction D2.

The discharge device DCD is connected to the first conductive pattern CP_1 and the second extension unit EX2 of the second line L2. The discharge device DCD may include a Zener diode. An anode electrode of the discharge device DCD is connected to the second extension unit EX2 of the second line L2 and a cathode electrode thereof is connected to the first conductive pattern CP_1. The discharge device DCD may be omitted.

The discharge pattern DCP is disposed adjacent to the conductive patterns CP_1 to CP_k and the second line L2 and directs static electricity flowing into the conductive patterns CP_1 to CP_k to the second line L2. In detail, the discharge pattern DCP may be disposed between the conductive patterns CP_1 to CP_k and the second extension unit EX2 of the second line L2 in the second direction D2, and extends in the first direction D1.

When the light source LS includes the discharge device DCD, the discharge pattern DCP is disposed between the second to k-th conductive patterns CP_2 to CP_k and the second extension unit EX2. When the light source LS does not include the discharge device DCD, the discharge pattern DCP may be disposed between the first to k-th conductive patterns CP_1 to CP_k and the second extension unit EX2.

The light source units LSUs serially connected by the conductive patterns CP_1 to CP_k may receive power through the first line L1 to be driven. The light source units LSUs receiving the power generate light.

When external static electricity flows into the first conductive pattern CP_1, the static electricity flowing into the first conduct pattern CP_1 may flow into the ground terminal through the discharge device DCD.

When the external static electricity flows into the second to the k-th conductive patterns CP_2 to CP_k, the static electricity flowing into the second to the k-th conductive patterns CP_2 to CP_k may be led to the discharge pattern DCP. When the light source LS does not include the discharge device DCD, static electricity flowing into the first to k-th conductive patterns CP_1 to CP_k may be led to the discharge pattern DCP.

Since the discharge pattern DCP is not electrically connected to the second to n-th conductive patterns CP_2 to CP_k, the power for driving the light source LS is not provided to the discharge pattern DCP. However, a high voltage such as the static electricity may be led to the discharge pattern DCP even though the discharge pattern DCP is not electrically connected to the second to k-th conductive patterns CP_2 to CP_k.

The static electricity led to the discharge pattern DCP may be led to the second extension unit EX2 of the second line L2 and may be discharged through the ground terminal connected to the second line L2. As a result, the light source units LSUs may be prevented from being damaged by the static electricity.

Consequently, the light source LS according to an embodiment of the present invention can prevent devices such as the light source units LSUs from being damaged by the static electricity.

Figure 2:
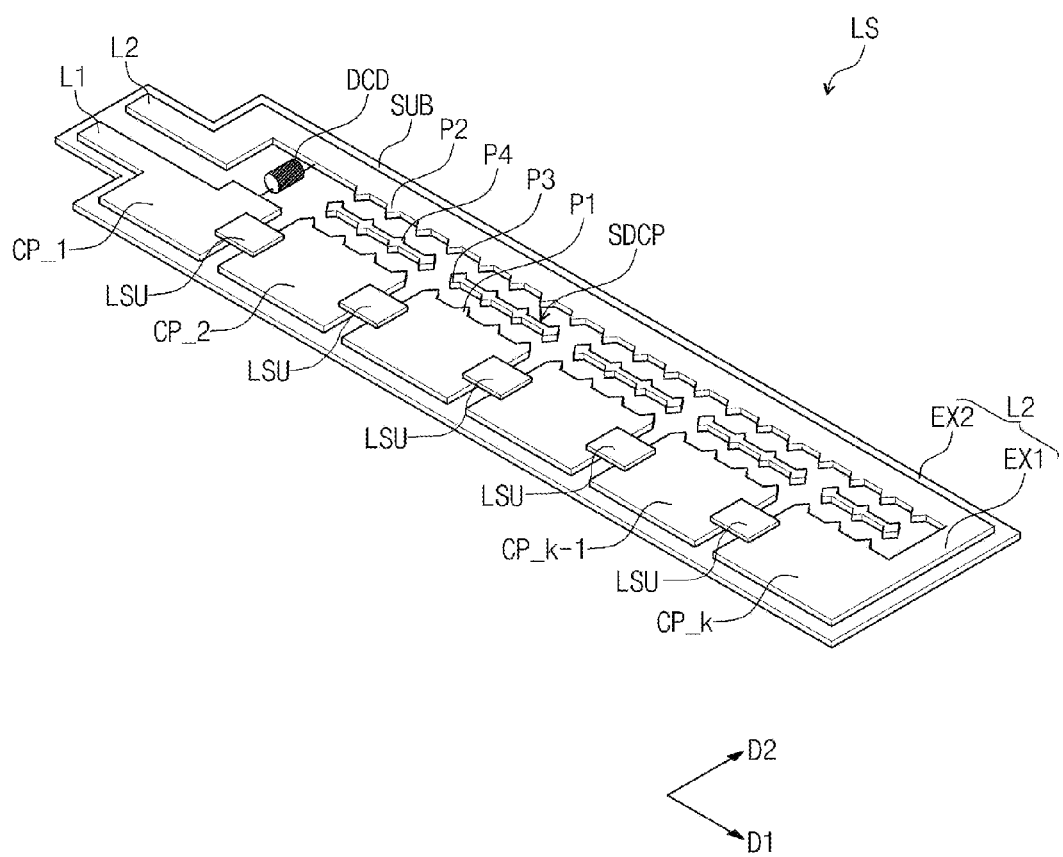
FIG. 2 is a perspective view of a light source according to a second embodiment of the invention.

FIG. 2 is a perspective view of a light source according to a second embodiment of the present invention.

The light source LS illustrated in FIG. 2 has the same configuration as that illustrated in FIG. 1 except for a configuration of the discharge pattern DCP, the conductive patterns CP_1 to CP_k, and the second extension unit EX2 of the second line L2. Accordingly, hereinafter, a different configuration from that illustrated in FIG. 1 will be described.

Referring to FIG. 2, the discharge pattern DCP includes a plurality of sub-discharge patterns SDCPs. The sub-discharge patterns SDCPs extend in the first direction D1 and are arrayed in the first direction D1.

The sub-discharge patterns SDCPs are disposed between the second to k-th conductive patterns CP_2 to CP_k and the second extension unit EX2 of the second line L2. In addition, the sub-discharge patterns SDCPs are disposed so as to respectively face corresponding second to k-th conductive patterns CP_2 to CP_k.

The second to k-th conductive patterns CP_2 to CP_k include a plurality of first protruding parts P1 protruding toward the sub-discharge patterns SDCPs from surfaces of the second to k-th conductive patterns CP_2 to CP_k facing the sub-discharge patterns SDCPs.

The second extension unit EX2 includes a plurality of second protruding parts P2 protruding toward the sub-discharge patterns SDCPs from a surface of the second extension units EX2 facing the sub-discharge patterns SDCPs.

The first and second protruding parts P1 and P2 may have a mountain shape. The first protruding parts P1 may be disposed so as to respectively face corresponding second protruding parts P2.

The sub-discharge patterns SDCPs include a plurality of third protruding parts P3 and a plurality of fourth protruding parts P4. The third protruding parts P3 protrude toward the second to k-th conductive patterns CP_2 to CP_k from surfaces of the sub-discharge patterns SDCPs facing the second to k-th conductive patterns CP_2 to CP_k. The fourth protruding parts P4 protrude toward the second extension unit EX2 from surfaces of the sub-discharge patterns SDCPs facing the second extension unit EX2 of the second line L2.

The third protruding parts P3 and the fourth protruding parts P4 are disposed so as to be symmetric. The third and fourth protruding parts P3 and P4 may have a mountain shape.

The third protruding parts P3 are disposed so as to respectively face the corresponding first protruding parts P1. The fourth protruding parts P4 are disposed so as to respectively face the corresponding second protruding parts P2.

When external static electricity flows into the second to the k-th conductive patterns CP_2 to CP_k, the static electricity flowing into the second to the k-th conductive patterns CP_2 to CP_k may be led to the sub-discharge patterns SDCPs.

The sub-discharge patterns SDCPs are not electrically connected to the second to k-th conductive patterns CP_2 to CP_k. In other words, the third protruding parts P3 are not electrically connected to the first protruding parts P1. Accordingly, the power for driving the light source LS is not provided to the sub-discharge patterns SDCPs.

However, a high voltage such as the static electricity may be led to the sub-discharge pattern SDCP, even though the sub-discharge pattern SDCP is not electrically connected to the second to k-th conductive patterns CP_2 to CP_k.

The static electricity directed to the sub-discharge patterns SDCPs may be directed to the second extension unit EX2 of the second line L2 and may be discharged through the ground terminal connected to the second line L2. As a result, the light source units LSUs may be prevented from being damaged by the static electricity.

In the second embodiment of the present invention, the mountain shapes of the first and third protruding parts P1 and P3 are disposed so as to face each other. In addition, the mountain shapes of the second and fourth protruding parts P2 and P4 are disposed so as to face each other. Accordingly, the light source LS according to a second embodiment of the present invention may discharge the static electricity more effectively than before.

Consequently, the light source LS according to the second embodiment of the present invention can prevent devices such as the light source units LSUs from being damaged by the static electricity.

Figure 3:
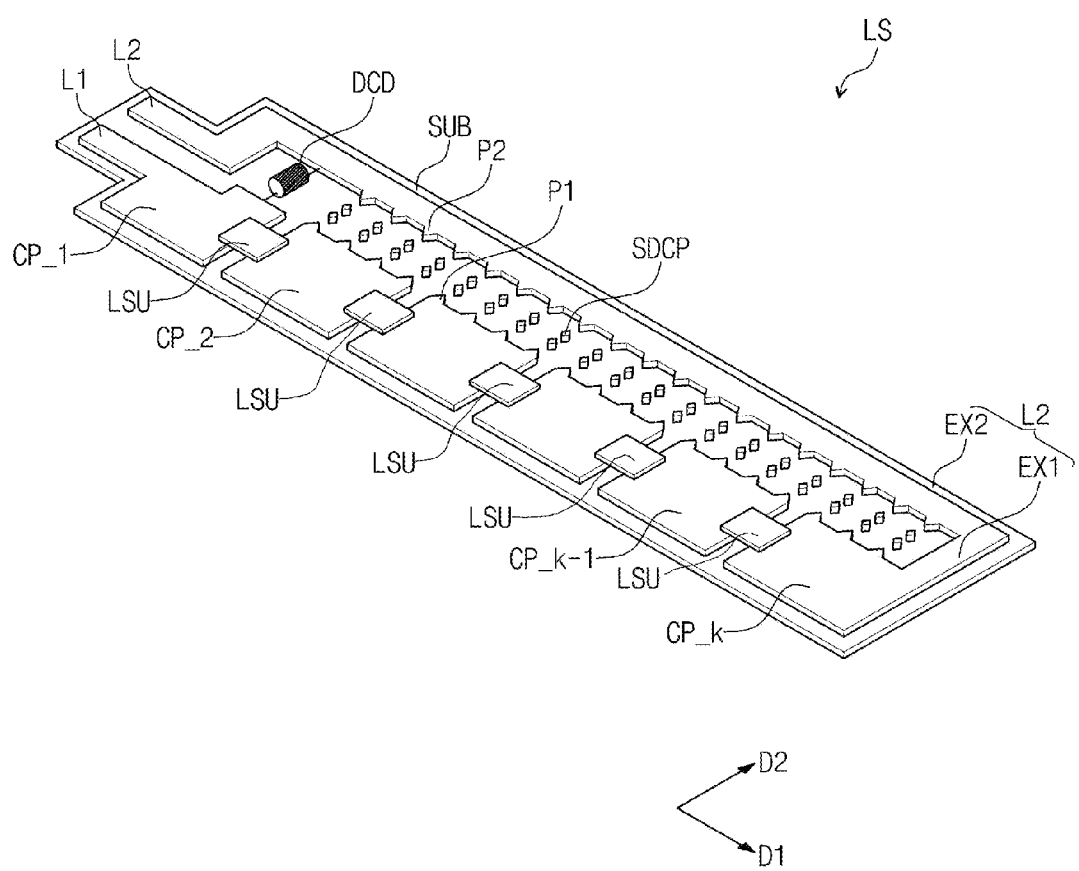
FIG. 3 is a perspective view of a light source according to a third embodiment of the invention.

FIG. 3 is a perspective view of a light source according to a third embodiment of the present invention;

The light source LS illustrated in FIG. 3 has the same configuration as that illustrated in FIG. 2 except for a configuration of the discharge pattern DCP. Accordingly, hereinafter, a different configuration from that of the light source LS illustrated in FIG. 2 will be described.

Referring to FIG. 3, the discharge pattern DCP includes a plurality of sub-discharge patterns SDCPs. The sub-discharge patterns SDCPs may have a diamond shape. The sub-discharge patterns SDCPs are disposed between the first protruding parts P1 of the second to k-th conductive patterns CP_2 to CP_k and the second protruding parts P2 of the second extension unit EX2 of the second line L2.

At least one diamond-shaped sub-discharge pattern SDCP may be disposed between the first and second protruding parts P1 and P2 facing each other.

For example, FIG. 3 illustrates two sub-discharge patterns SDCPs between the first and second protruding parts P1 and P2 facing each other. However, the sub-discharge patterns SDCPs are not limited to one or two, and more sub-discharge patterns SDCPs, greater than one or two, may be disposed between the first and second protruding parts P1 and P2.

When external static electricity flows into the second to the k-th conductive patterns CP_2 to CP_k, the static electricity flowing into the second to the k-th conductive patterns CP_2 to CP_k may be led to the sub-discharge patterns SDCPs.

The static electricity led to the sub-discharge patterns SDCPs may be led to the second extension unit EX2 of the second line L2 and may be discharged through the ground terminal connected to the second line L2. As a result, the light source units LSUs may be prevented from being damaged by the static electricity.

According to the third embodiment of the present invention, the top ends having the diamond shapes of the sub-discharge patterns SDCPs adjacent to the first protruding parts P1 in the second direction D2 are disposed so as to face the mountain shapes of the first protruding parts P1. In addition, the bottom ends having the diamond shapes of the sub-discharge patterns SDCPs adjacent to the second protruding parts P2 in the second direction D2 are disposed so as to face the mountain shapes of the second protruding parts P2. Accordingly, the light source LS according to the third embodiment of the present invention may discharge the static electricity more effectively than before.

Consequently, the light source LS according to the third embodiment of the present invention can prevent devices, such as the light source units LSUs, from being damaged by the static electricity.

Figure 4:
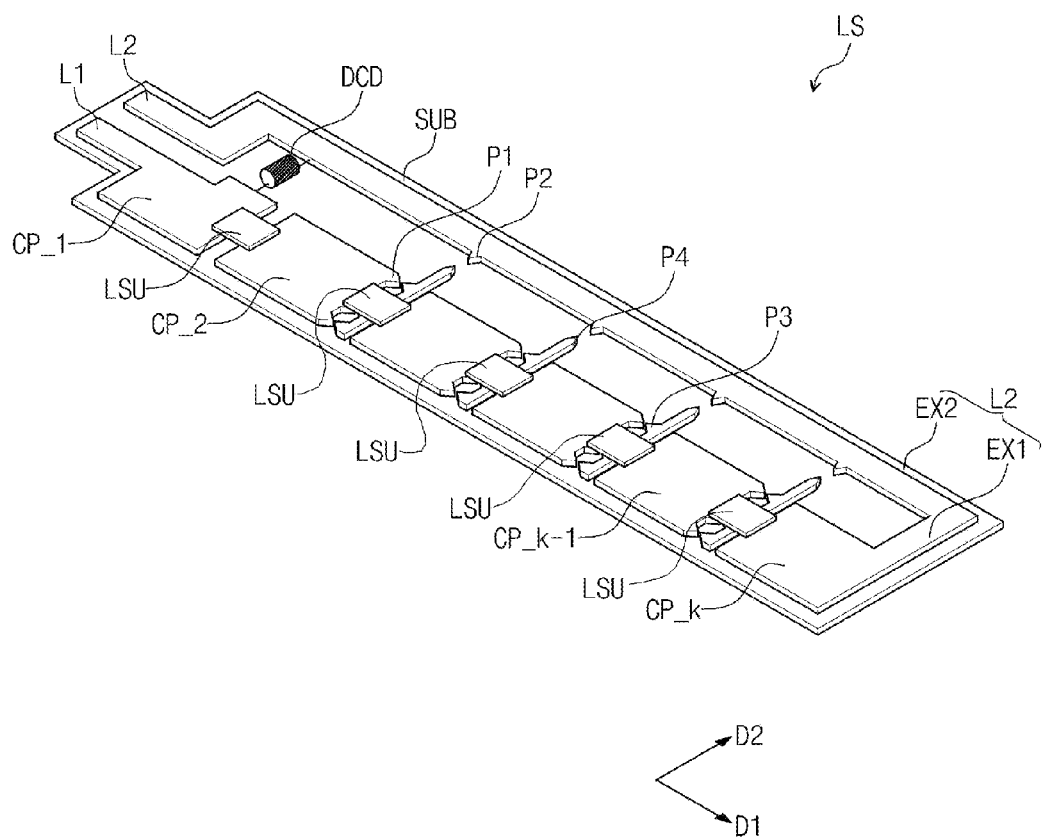
FIG. 4 is a perspective view of a light source according to a fourth embodiment of the invention.

FIG. 4 is a perspective view of a light source according to a fourth embodiment of the present invention.

The light source LS illustrated in FIG. 4 has the same configuration as that illustrated in FIG. 1 except for a configuration of the discharge pattern DCP, the conductive patterns CP_1 to CP_k, and the second extension unit EX2 of the second line L2. Accordingly, hereinafter, a different configuration from that of the light source LS illustrated in FIG. 1 will be described.

Referring to FIG. 4, the discharge pattern DCP includes a plurality of sub-discharge patterns SDCPs disposed between adjacent conductive patterns CP_2 to CP_k among the second to k-th conductive patterns CP_2 to CP_k. The sub-discharge patterns SDCPs extend in the second direction D2 and are disposed so as to be adjacent to the second extension unit EX2 in the second direction D2.

The second to (k−1)-th conductive patterns CP_2 to CP_k−1 include a plurality of first protruding parts P1 protruding toward the sub-discharge patterns SDCPs from each of the right surfaces of the second to (k−1)-th conductive patterns CP_2 to CP_k−1 in the first direction D1.

The second extension unit EX2 of the second line L2 includes the plurality of second protruding parts P2 extending toward the sub-discharge patterns SDCPs from a surface of the second extension unit EX2 facing the sub-discharge patterns SDCPs in the second direction D2.

The sub-discharge patterns SDCPs include a plurality of third protruding parts P3 protruding so as to face the first protruding parts P1 of the second to (k−1)-th conductive patterns CP_2 to CP_k−1 respectively corresponding thereto, and a plurality of fourth protruding parts P4 protruding so as to face the corresponding second protruding parts P2 in the second direction D2. The fourth protruding parts P4 may protrude from ends of the sub-discharge patterns SDCPs extending in the second direction D2. The first to fourth protruding parts P1 to P4 may have a mountain shape.

When external static electricity flows into the second to the k-th conductive patterns CP_2 to CP_k, the static electricity flowing into the second to the k-th conductive patterns CP_2 to CP_k may be led to the sub-discharge patterns SDCPs.

The static electricity led to the sub-discharge patterns SDCPs may be led to the second extension unit EX2 of the second line L2 and may be discharged through the ground terminal connected to the second line L2. As a result, the light source units LSUs may be prevented from being damaged by the static electricity.

Consequently, the light source LS according to the fourth embodiment of the present invention can prevent devices such as the light source units LSUs from being damaged by the static electricity.

Figure 5:
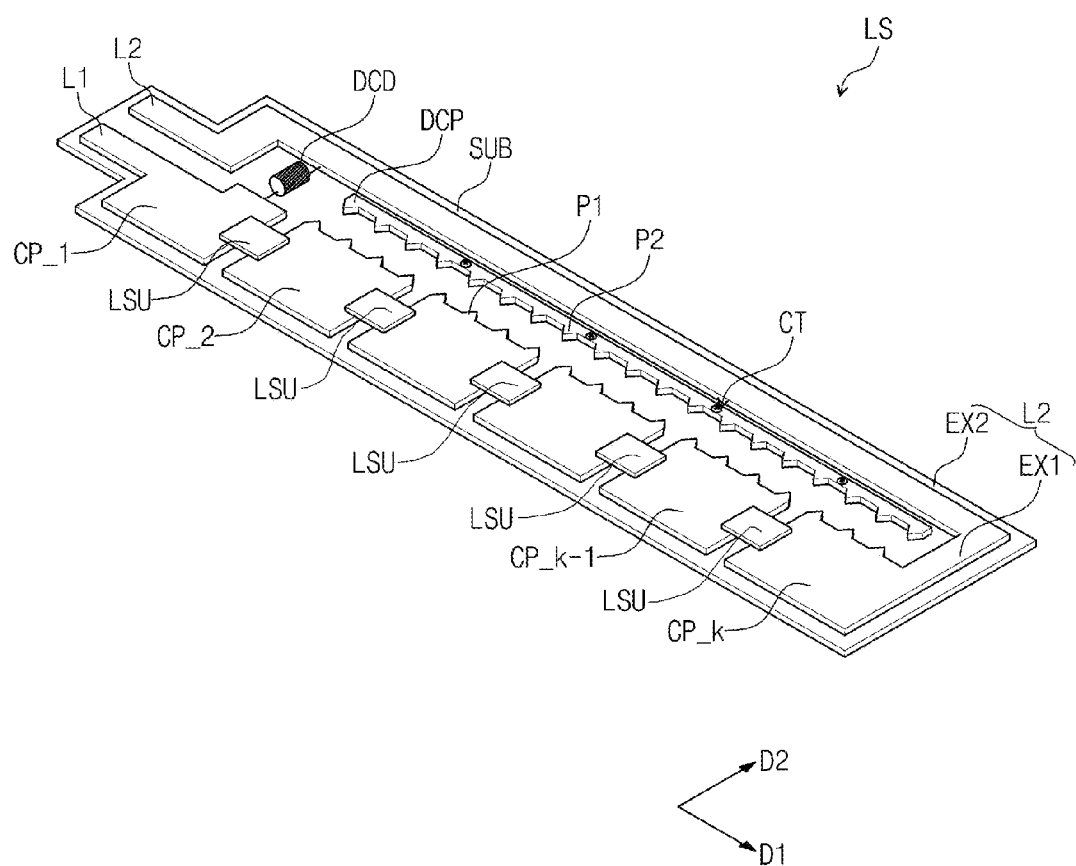
FIG. 5 is a perspective view of a light source according to a fifth embodiment of the invention.

FIG. 5 is a perspective view of a light source according to a fifth embodiment of the present invention.

The light source LS illustrated in FIG. 5 has the same configuration as that illustrated in FIG. 1 except for a configuration of the discharge pattern DCP and the conductive patterns CP_1 to CP_k. Hereinafter, a different configuration from that of the light source LS illustrated in FIG. 1 will be described.

Referring to FIG. 5, the discharge pattern DCP is disposed adjacent to the second to k-th conductive patterns CP_2 to CP_k and the second line L2, and leads static electricity flowing into the conductive patterns CP_2 to CP_k to the second line L2. In detail, the discharge pattern DCP may be disposed between the conductive patterns CP_1 to CP_k and the second extension unit EX2 of the second line L2, and may extend in the first direction D1.

The second to k-th conductive patterns CP_2 to CP_k include a plurality of first protruding parts P1 protruding toward the discharge pattern DCP from surfaces of the second to k-th conductive patterns CP_2 to CP_k facing the discharge pattern DCP.

The discharge pattern DCP includes a plurality of second protruding parts P2. The second protruding units P2 protrude toward the second to k-th conductive patterns CP_2 to CP_k from a surface of the discharge pattern DCP facing the second to k-th conductive patterns CP_2 to CP_k.

The first and second protruding units P1 and P2 may have a mountain shape. The first protruding units P1 may be disposed so as to respectively face the corresponding second protruding units P2.

When the external static electricity flows into the second to the k-th conductive patterns CP_2 to CP_k, the static electricity flowing into the second to the k-th conductive patterns CP_2 to CP_k may be led to the discharge pattern DCP.

At least one connection terminal CT may be disposed onto the discharge pattern DCP. The connection terminal CT may include a conductive material. For example, the connection terminal may be a nail or a screw.

The connection terminal CT may penetrate through the discharge pattern DCP and may be connected to a ground terminal. Accordingly, static electricity led to the discharge pattern DCP may be discharged to the ground terminal through the connection terminal CT. As a result, the light source units LSUs may be prevented from being damaged by static electricity.

Since the light source LS according to the fifth embodiment of the present invention may allow the mountain shapes of the first and second protruding parts P1 and P2 to face each other, the static electricity may be discharged more effectively than before.

Consequently, the light source LS according to the fifth embodiment of the present invention can prevent devices, such as the light source units LSUs, from being damaged by the static electricity.

Figure 6:
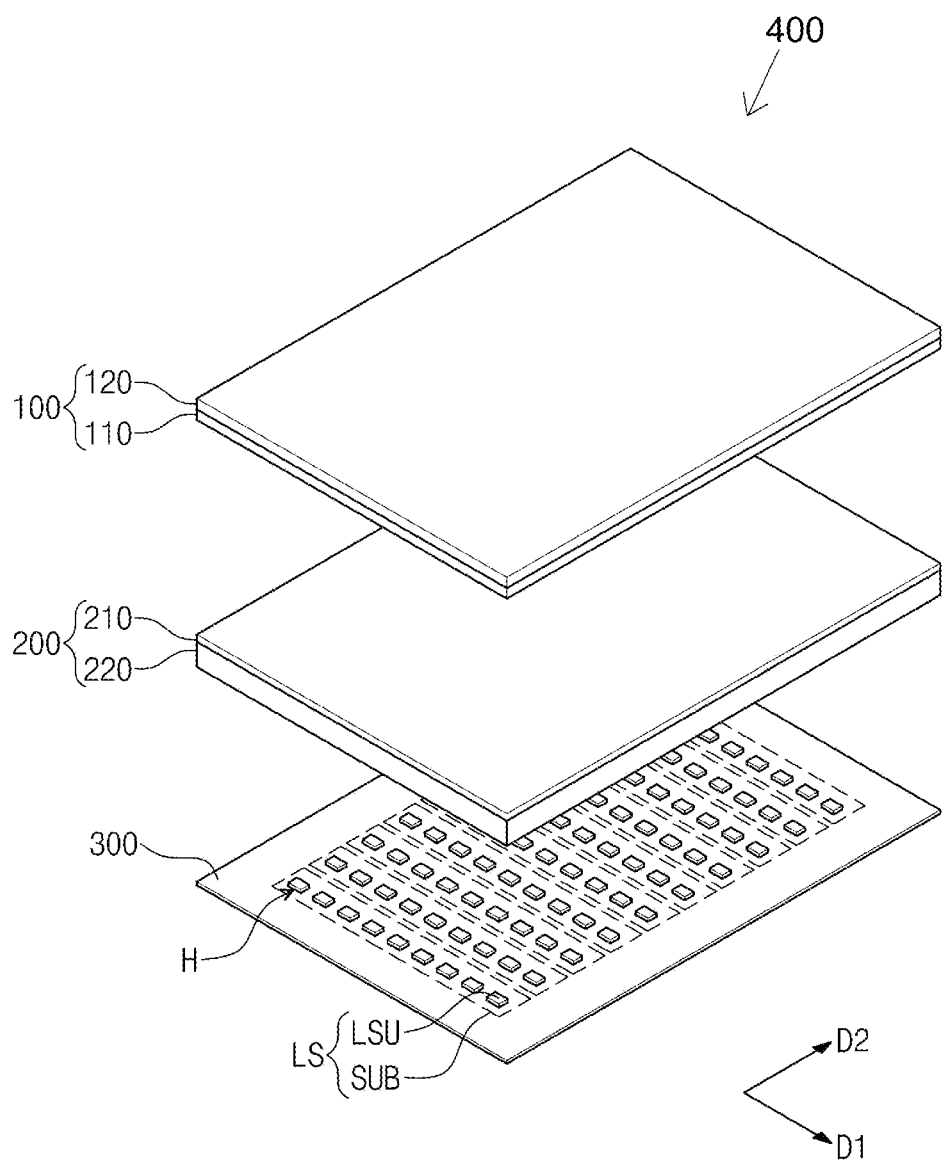
FIG. 6 is an exploded perspective view of a display device according to the first to fifth embodiments of the invention.

FIG. 6 is an exploded perspective view of a display device according to the first to fifth embodiments.

Referring to FIG. 6, a display device 400 according to the first to fifth embodiments includes a short side in the first direction D1 and a long side in the second direction D2 intersecting with the first direction D1. The display device 400 includes a display panel 100, an optical member 200, a reflection sheet 300, and a light source LS.

The display panel 100 may be a liquid crystal display panel. The display panel 100 may include a display substrate 110 and a counter substrate 120 disposed so as to face the display substrate 110. Although not illustrated in the drawing, the display panel 100 may include a liquid crystal layer disposed between the display substrate 110 and the counter substrate 120.

Although not illustrated in the drawing, the display substrate 110 may include a plurality of pixels, and each of the pixels may include a pixel electrode and a thin film transistor. The counter substrate 120 may include a common electrode facing the pixel electrodes and a color filter allowing light to be colored.

The optical member 200 is disposed on the rear side of the display panel 100. The optical member 200 may include an optical sheet 210 and a diffusion plate 220.

Although not illustrated in the drawing, the optical sheet 210 includes a diffusion sheet, a prism sheet disposed on the diffusion sheet, and a protection sheet disposed on the prism sheet. The diffusion sheet may play a role in diffusing light incident from the diffusion plate 220. The prism sheet may play a role in collecting the light diffused by the diffusion sheet in a vertical direction relative to a plane of the display panel 100. The light transmitted through the prism sheet may travel vertically so as to provide uniform luminance distribution. The protection sheet may play a role in protecting the prism sheet which may be weak with respect to scratches.

The diffusion plate 220 is disposed on the rear side of the optical sheet 210. The diffusion plate 220 may have diffusion agent distributed therein or a diffusion agent layer coated thereon. The diffusion plate 220 is not easily bended and has rigidity. The thickness of the diffusion plate 220 may be greater than the thickness of the optical sheet 210.

The reflection sheet 300 is disposed on the rear side of the diffusion plate 220. The reflection sheet 300 plays a role in reflecting light incident from the rear side of the light source LS so as to provide the reflected light to the diffusion plate 220.

The reflection sheet 300 may include a plurality of holes H. The holes H may be arrayed in a matrix shape on the reflection sheet 300.

The light source LS is disposed on the rear side of the reflection sheet 300. The light source LS extends in the first direction D1. The light sources LS may be disposed at a uniform interval in the first direction D1.

The light sources LS include a plurality of light source units LSUs generating light and a plurality of substrates SUBs on which the light source units LSUs are mounted. The substrates SUBs extend in the first direction D1 and are disposed at a uniform interval along the second direction D2. The light source units LSUs mounted on the substrates SUBs extend in the first direction D1 and may be arrayed with a uniform interval along the second direction D2. In other words, the light source units LSUs may be arrayed in a matrix shape.

The light source units LSUs may include light emitting diodes. The light source units LSUs may have a quadrangle shape. However, the shape of the light source units LSUs is not limited thereto, and they may have various shapes, such as a circular shape and a polygonal shape.

The light source units LSUs may be inserted into the holes H disposed through the reflection sheet 300. At this point, the holes H may be formed on the reflection sheet 300 so as to allow positions and sizes thereof to correspond to positions and sizes of the light source units LSUs.

The light source LS may be any one of the light sources LS illustrated in FIGS. 1 to 5. In other words, the light source units LSUs according to the first to fifth embodiments of the present invention may be applied to the display device 400.

The light source units LSUs may be inserted into the holes H disposed through the reflection sheet 300. At this point, the holes H may be formed through the reflection sheet 300 so as to allow positions and sizes thereof to correspond to positions and sizes of the light source units LSUs.

The light generated by the light source < is provided to the diffusion plate 220 and becomes diffused. In addition, light incident from the rear side of the light source < is reflected by a reflection sheet to be provided to the diffusion plate 220. The light diffused by the diffusion plate 220 is diffused and collected by the optical sheet 210, and is provided to the display penal. The display panel displays an image using the light.

The display device according to an embodiment of the present invention includes any one light source among the light sources illustrated in FIGS. 1 to 5. Accordingly, the display device according to the embodiment of the present invention can prevent the light source units from being damaged.

The light source and the display device of the present invention can prevent a device from being damaged by static electricity.

The above-disclosed subject matter is to be considered illustrative and not restrictive, and the appended claims are intended to cover all such modifications, enhancements, and other embodiments, which fall within the true spirit and scope of the invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A light source, comprising:
    a first line receiving power;
    a second line connected to a ground terminal;
    a plurality of light source units generating light;
    first to k-th conductive patterns connecting the light source units to the first and second lines in series, where k is a natural number greater than 1; and
    a discharge pattern disposed between at least some of the first to k-th conductive patterns and the second line, and leading static electricity flowing into the conductive patterns to the second line.

2. The light source of claim 1, wherein the first to k-th conductive patterns and the light source units are arrayed in a first direction with a uniform interval and are connected;
    wherein the discharge pattern is extended along the first direction; and
    wherein the first line is connected to the first conductive pattern among the first to k-th conductive patterns and the second line is connected to the k-th conductive pattern among the first to k-th conductive patterns.

3. The light source of claim 2, wherein the second line comprises:
    a first extension unit extending along a second direction intersecting the first direction, and connected to the k-th conductive pattern; and
    a second extension unit extending along the first direction from the first extension unit, and disposed so as to face the first to k-th conductive patterns in the second direction.

4. The light source of claim 3, further comprising a discharge device connected to the first conductive pattern, from among the first to k-th conduction patterns, and connected to the second line.

5. The light source of claim 4, wherein the discharge device comprises a Zener diode having an anode electrode and a cathode electrode, the anode electrode being connected to the second line and the cathode electrode being connected to the first conductive pattern.

6. The light source of claim 3, wherein the discharge pattern comprises a plurality of sub-discharge patterns extending in the first direction and arrayed in the first direction; and
    wherein the sub-discharge patterns are disposed between the second to k-th conductive patterns and the second extension unit so as to respectively face the corresponding second to k-th conductive patterns.

7. The light source of claim 6, wherein the second to k-th conductive patterns comprise a plurality of first protruding parts protruding toward the sub-discharge patterns from surfaces of the second to k-th conductive patterns facing the sub-discharge patterns; and
    wherein the second extension unit comprises a plurality of second protruding parts protruding toward the sub-discharge patterns from a surface of the second extension unit facing the sub-discharge patterns.

8. The light source of claim 7, wherein the sub-discharge patterns comprise:
    third protruding parts protruding toward the second to k-th conductive patterns from surfaces of the sub-discharge patterns facing the second to k-th conductive patterns; and
    fourth protruding parts protruding toward the second extension unit from the surfaces of the sub-discharge patterns facing the second extension unit;
    wherein the third protruding parts are disposed so as to respectively face corresponding first protruding parts and the fourth protruding parts are disposed so as to respectively face corresponding second protruding parts.

9. The light source of claim 8, wherein the first to fourth protruding parts have a mountain shape.

10. The light source of claim 6, wherein each of the second to k-th conductive patterns comprise a plurality of first protruding parts protruding toward the sub-discharge patterns from the surfaces of the second to k-th conductive patterns facing the sub-discharge patterns;
wherein the second extension unit comprises a plurality of second protruding units protruding toward the sub-discharge patterns from a surface of the second extension unit facing the sub-discharge patterns; and
wherein the sub-discharge patterns are disposed between the first and second protruding parts facing each other.

11. The light source of claim 3, wherein the discharge pattern comprises a plurality of sub-discharge patterns disposed between the second to k-th conductive patterns and the second extension unit, and having a diamond shape.

12. The light source of claim 3, wherein the discharge pattern comprises a plurality of sub-discharge patterns disposed between adjacent conductive patterns among the second to k-th conductive patterns and extending in the second direction.

13. The light source of claim 12, wherein the conductive patterns comprise a plurality of first protruding parts protruding toward the sub-discharge patterns from right surfaces of the conductive patterns in the first direction; and
wherein the second extension unit comprises a plurality of second protruding parts extending toward the sub-discharge patterns from a surface of the second extension unit facing the sub-discharge patterns in the second direction.

14. The light source of claim 13, wherein the sub-discharge patterns comprise:
a plurality of third protruding parts protruding so as to respectively face corresponding first protruding parts; and
fourth protruding parts protruding so as to face the second protruding parts in the second direction;
wherein the fourth protruding parts protrude from ends of the sub-discharge patterns extending in the second direction; and
wherein the third protruding parts are disposed so as to respectively face the corresponding first protruding parts, and the fourth protruding parts are disposed so as to respectively face corresponding second protruding parts.

15. The light source of claim 3, further comprising at least one connection terminal disposed on the discharge pattern;
wherein the connection terminal comprises a conductive material and penetrates the discharge pattern so as to be connected to a ground terminal.

16. The light source of claim 15, wherein the second to k-th conductive patterns comprise a plurality of first protruding parts protruding toward the discharge pattern from surfaces of the second to k-th conductive patterns facing the discharge pattern;
wherein the discharge pattern comprises a plurality of third protruding parts protruding toward the second to k-th conductive patterns from a surface of the discharge pattern facing the second to k-th conductive patterns; and
wherein the first protruding parts are disposed so as to respectively face the corresponding third protruding parts.

17. The light source of claim 1, wherein the light source units respectively comprise light emitting diodes and are serially connected in a forward direction through the first to k-th conductive patterns.

18. The light source of claim 1, further comprising a substrate on which the first line, the second line, the light source units, the conduction patterns and the discharge pattern are disposed.

19. A display device, comprising:
a light source emitting light; and
a display panel receiving the light to display an image;
wherein the light source comprises:
a first line receiving power;
a second line connected to a ground terminal;
a plurality of light source units generating light;
a plurality of conductive patterns connecting the light source units to the first and second lines in series; and
a discharge pattern disposed between at least one of the conductive patterns and the second line so as to lead static electricity flowing into the conductive patterns to the second line.

* * * * *